(12) United States Patent
Kirihata et al.

(10) Patent No.: US 6,587,388 B2
(45) Date of Patent: Jul. 1, 2003

(54) METHOD AND APPARATUS FOR REDUCING WRITE OPERATION TIME IN DYNAMIC RANDOM ACCESS MEMORIES

(75) Inventors: Toshiaki Kirihata, Poughkeepsie, NY (US); Sang Hoo Dhong, Austin, TX (US); Hwa-Joon Oh, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/844,837

(22) Filed: Apr. 27, 2001

(65) Prior Publication Data

US 2002/0159319 A1 Oct. 31, 2002

(51) Int. Cl.[7] ................................................ G11C 7/00
(52) U.S. Cl. ........................ 365/203; 365/205; 365/207
(58) Field of Search ................................ 365/203, 205, 365/207, 189.05, 230.06

(56) References Cited

U.S. PATENT DOCUMENTS

| | | | | |
|---|---|---|---|---|
| 5,600,601 A | * | 2/1997 | Murakami et al. | 365/203 |
| 5,784,705 A | | 7/1998 | Leung | 711/169 |
| 5,920,885 A | * | 7/1999 | Rao | 365/193 |
| 5,926,839 A | | 7/1999 | Katayama | 711/169 |
| 5,949,732 A | | 9/1999 | Kirihata | 365/230.03 |
| 5,991,851 A | | 11/1999 | Alwais et al. | 711/106 |
| 6,078,547 A | | 6/2000 | Leung | 365/233 |
| 6,085,300 A | | 7/2000 | Sunaga et al. | 711/168 |
| 6,097,658 A | * | 8/2000 | Satoh et al. | 365/203 |
| 6,178,479 B1 | | 1/2001 | Vishin | 711/106 |
| 6,188,627 B1 | | 2/2001 | Blackmon et al. | 365/222 |
| 6,191,988 B1 | | 2/2001 | DeBrosse | 365/205 |
| 6,205,071 B1 | * | 3/2001 | Ooishi | 365/205 |
| 6,327,202 B1 | * | 12/2001 | Roohparvar | 365/203 |

OTHER PUBLICATIONS

Toshiaki Kirihata, Yohji Watanabe, Hing Wong, John K. DeBrosee, Munehiro Yoshida, Daisuke Kato, Shuso Fuji, Matthew R. Wordeman, Peter Poechmueller, Stephen A. Parke, and Yoskiaki Asao, "Fault–Tolerant Designes for 256 Mb DRAM," IEEE Journal of Solid State Circuits, vol. 31, pp. 558–566, Apr. 4, 1996.

Takeshi Nagai, Kenji Numata, Masaki Ogihara, Mitsuru Simizu, Kimimasa Imai, Takahiko Hara, Munehiro Yoshida, Yoshikazu Saito, Yoshiaki Asao, Shizuo Sawada, and Syuso Fujii, "A 17–ns 4Mb CMOS DRAM," IEEE Journal of Solid–State Curcuits, vol. 26, pp. 1538–1543, Nov. 11, 1991.

* cited by examiner

Primary Examiner—Michael S. Lebentritt
Assistant Examiner—Hien Nguyen
(74) Attorney, Agent, or Firm—Robert A. Walsh; Cantor Colburn LLP

(57) ABSTRACT

A method for preparing a dynamic random access memory (DRAM) cell for a write operation with a preset condition is disclosed. In an exemplary embodiment, the method includes creating a preset voltage level within the cell prior to a delayed write back in a destructive read architecture, which preset voltage level has a value between a logic 0 voltage level and a logic 1 voltage level. The logic 0 voltage level corresponds to a first cell voltage value when the cell has a 0 bit stored therein, and the logic 1 voltage level corresponds to a second cell voltage value when the cell has a 1 bit stored therein. Prior to the creation of the preset voltage level within the cell, the cell has an initial voltage value corresponding to either the logic 0 voltage level or the logic 1 voltage level.

32 Claims, 4 Drawing Sheets

METHOD AND APPARATUS FOR REDUCING WRITE OPERATION TIME IN DYNAMIC RANDOM ACCESS MEMORIES

BACKGROUND

The present invention relates generally to integrated circuit memory devices and, more particularly, to improving write time for Dynamic Random Access Memories (DRAMs) having a destructive read architecture.

The evolution of sub-micron CMOS technology has resulted in significant improvement in microprocessor speeds. Quadrupling roughly every three years, microprocessor speeds have now even exceeded 1 Ghz. Along with these advances in microprocessor technology have come more advanced software and multimedia applications, requiring larger memories for the application thereof. Accordingly, there is an increasing demand for larger Dynamic Random Access Memories (DRAMs) with higher density, speed and performance.

One of the longest delays associated with the operation of a DRAM is the write time thereto. An individual DRAM cell, having a transistor and a capacitor as its core components, also has internal resistance and parasitic capacitances as a result of the metallic and dielectric material used in the fabrication thereof. In turn, the internal resistance and parasitic capacitances cause an RC time delay when the cell voltage is changed from one logic state to the other logic state. This is particularly the case where a DRAM cell initially has a "logic 0" bit stored therein (e.g., the cell voltage is at 0 volts or ground), and it is thereafter desired to write a "logic 1" to the cell (e.g., increasing the cell voltage to a selected supply voltage value VDD).

Because a write operation is often performed sequentially with other operations (e.g., a read operation) in a conventional DRAM architecture, the overall delay in completing an entire DRAM operation can become problematic.

BRIEF SUMMARY

The above discussed and other drawbacks and deficiencies of the prior art are overcome or alleviated by a method for preparing a dynamic random access memory (DRAM) cell for a write operation, thereby creating a preset condition prior to a write back operation in a destructive read architecture. In an exemplary embodiment, the method includes creating a preset voltage level within the cell, which preset voltage level has a value between a logic 0 voltage level and a logic 1 voltage level. The logic 0 voltage level corresponds to a first cell voltage value when the cell has a 0 bit stored therein, and the logic 1 voltage level corresponds to a second cell voltage value when the cell has a 1 bit stored therein. Prior to the creation of the preset voltage level within the cell, the cell has an initial voltage value corresponding to either the logic 0 voltage level or the logic 1 voltage level.

In one embodiment, the preset voltage level is about halfway between the logic 1 voltage level and the logic 0 voltage level. The preset voltage level is greater than half the difference between the logic 1 voltage level and the logic 0 voltage level if the initial voltage value of the cell corresponds to the logic 1 voltage level. However, the preset voltage level is less than half the difference between the logic 1 voltage level and the logic 0 voltage level if the initial voltage value of the cell corresponds to said logic 0 voltage level. In an alternative embodiment, the preset voltage level is at least ¾ of the logic 1 voltage level.

BRIEF DESCRIPTION OF THE DRAWINGS

Referring to the exemplary drawings wherein like elements are numbered alike in the several Figures.

DETAILED DESCRIPTION

Figure 1A:
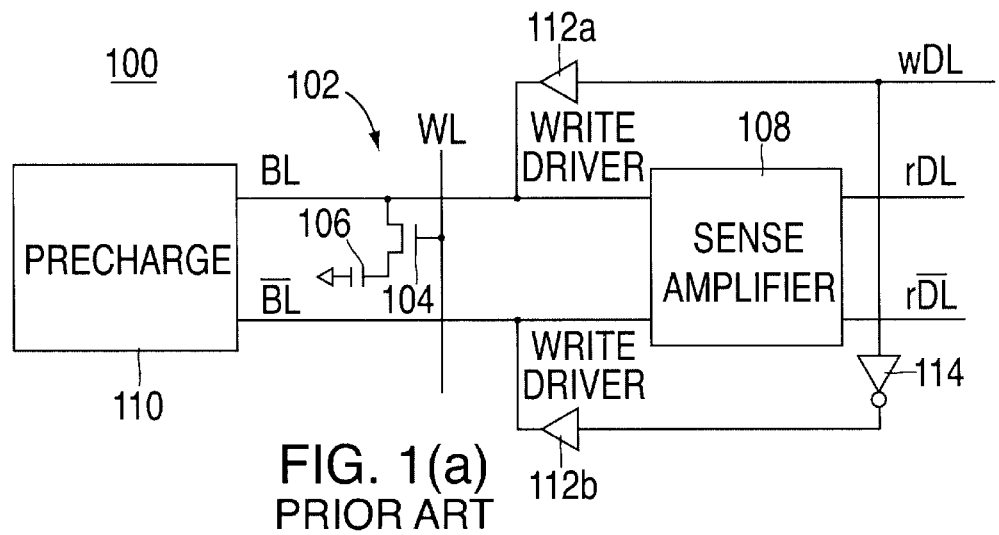
FIG. 1(a) is a schematic of an existing single DRAM structure.

Referring initially to FIG. 1(a), there is shown a conventional DRAM array structure 100. The DRAM array structure 100 includes a plurality of DRAM cells 102 arranged in a matrix pattern. Each DRAM cell 102 comprises one field effect transistor (FET) 104 and one capacitor 106, functioning as a data bit storage element. The gate of transistor 104 is connected to a wordline (WL) such that when WL is selectively energized, the capacitor 106 is coupled to a bitline (BL). The bitline BL, along with its complement (BL bar), are both used to transmit data stored in cell 102 to a sense amplifier 108 which, in turn, amplifies a differential voltage sensed on BL and BL bar. This amplified voltage represents a data bit that is outputted to a determined location through lines rDL and rDL bar.

In order to develop a differential voltage on BL and BL bar for a read operation, BL and BL bar are first equalized by a precharging circuit 110. The precharging circuit 110 may include, for example, a plurality of bitline equalizing transistors which are known in the art. Finally, a pair of write drivers 112a, 112b connect a data write line (wDL) to BL and BL bar, respectively. The write drivers 112a and 112b are enabled only when a write back operation is enabled; otherwise, they are in a tri-state condition. An inverter 114 allows the complement of a data bit on wDL to be transmitted to BL bar.

Figure 1B:
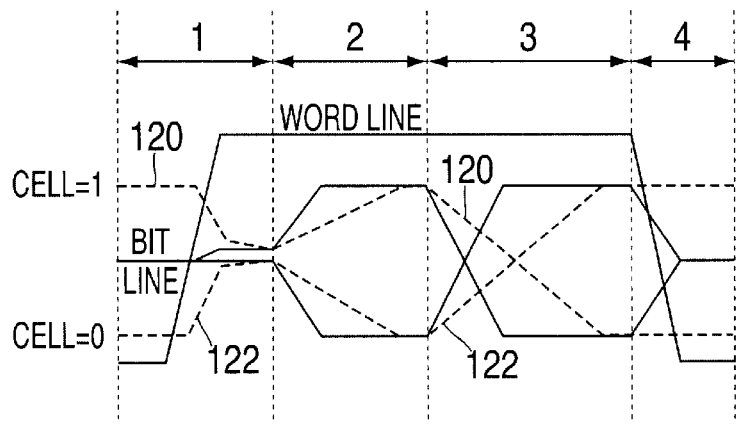
FIG. 1(b) is a signal timing diagram illustrating the DRAM cell voltage characteristics during a conventional read/modify write operation.

The timing diagram in FIG. 1(b) illustrates a conventional read/modify write operation for the structure 100 described above. Initially, during phase 1 (signal development), BL and BL bar are precharged to an equal precharge voltage level by precharging circuit 110. The precharge voltage level is about halfway between a logic 1 voltage level and a logic 0 voltage level. By way of example only, the logic 1 voltage value (or VDD) may be about 3.0 volts, while the logic 0 voltage level may be 0 volts, or ground. However, it will easily be appreciated that other voltage values may be used to represent logic 1 and logic 0. Thus, in this example, the precharge voltage value for BL and BL bar is about 1.5 volts.

Immediately prior to WL being activated, the cell 102 (more particularly, capacitor 106) will have either a "1" bit or a "0" bit stored therein. Thus, the initial cell voltage of the capacitor 106 will be either 3.0 volts (indicated by dotted line 120) or 0 volts (indicated by dotted line 122). When the wordline WL is activated, the precharge circuit 110 is uncoupled from BL and BL bar. At this point, the gate of transistor 104 is turned on and capacitor 106 is then coupled to BL. Assuming, for example, that a "1" was originally stored in cell 102, the voltage on capacitor 106 is 3.0 volts just before the voltage on WL goes from low to high. However, once capacitor 106 (at 3.0 volts) is coupled to BL (at 1.5 volts), the charge stored on capacitor 106 begins to transfer to BL. As a result, the cell voltage drops from 3.0 volts, while the voltage on BL begins to increase slightly. Because the voltage on BL bar remains at 1.5 volts, a differential voltage is therefore developed across BL and BL bar.

During phase 2 (signal amplification), the sense amplifier 108 senses the differential voltage across BL and BL bar and amplifies the voltage on BL to its full logic value. Typically, a CMOS cross-coupled sense amplifier is used in this instance, which cross-coupled amplifiers are well known in the art and are not discussed in further detail hereinafter. Again, in the example illustrated, a "1" bit is read from the cell 102, and thus the voltage on BL is increased to 3.0 volts. Because WL is still activated, the voltage on capacitor 106 is also increased to 3.0 volts. Then, during phase 3, a "modify write" is executed, wherein a "0" bit is to be written into cell 102. This write data, originating on wDL, is sent through write driver 112a to BL. Accordingly, the voltage on BL is then "flipped" from 3.0 volts to 0 volts. It can be seen from FIG. 1(b) that cell voltage (dotted line 120) follows the voltage on BL down to 0 volts.

Finally, in phase 4, once the cell voltage is equal to the logic 0 voltage, the wordline is deactivated and capacitor 106 is uncoupled from BL. Capacitor 106 is discharged to 0 volts while the precharge circuit precharges BL and BL bar back to ½ VDD, or 1.5 volts.

Figure 1C:
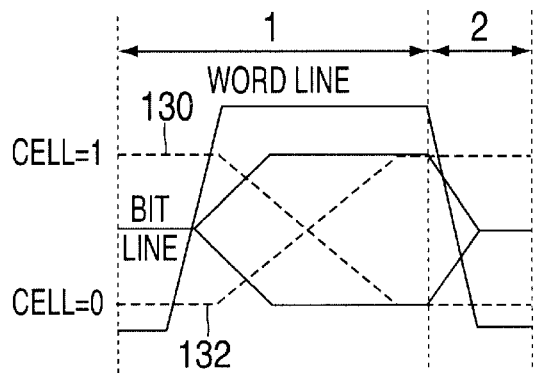
FIG. 1(c) is a signal timing diagram illustrating the DRAM cell voltage characteristics during a conventional direct write operation.

Referring now to FIG. 1(c), another conventional DRAM write operation is illustrated. Instead of a read/modify write operation, FIG. 1(c) shows a direct write operation without a read operation beforehand. Similar to the diagram in FIG. 1(b), the diagram of FIG. 1(c) illustrates a write operation where the stored bit is changed from "1" to "0" (dashed line 130), as well as where the stored bit is changed from "0" to "1" (dashed line 132). In phase 1, the bitlines BL and BL bar are precharged to 1.5 volts. When WL is activated (again, assuming the cell voltage is initially 3.0 volts for a "1 bit"), both the voltage on BL and the cell voltage are driven to 0 volts by write driver 112a. After the cell voltage is equal to 0 volts, WL is deactivated, capacitor 106 is isolated from BL, and the bitlines are again precharged to 1.5 volts. A "0" bit is now stored in cell 102.

The DRAM write operation is not completed until after the cell voltage has been fully charged or discharged. Because of the RC time constant associated with changing the cell voltage from the logic 1 voltage level to the logic 0 voltage level and vice versa, as outlined earlier, the overall operation speed is limited. In order to improve upon the write time of a DRAM cell, therefore, the charging/discharging time of capacitor 106 should be reduced.

Figure 2:
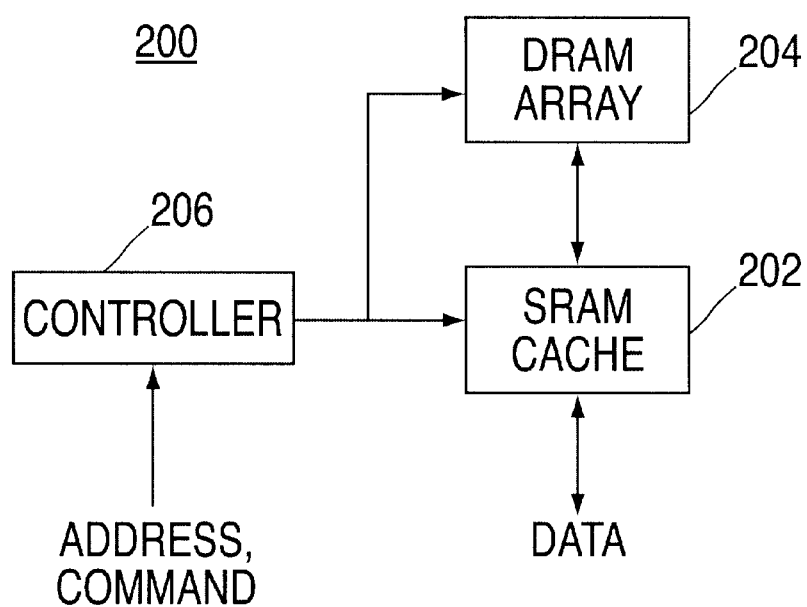
FIG. 2 is a simplified block diagram of a DRAM control architecture used in accordance with an embodiment of the invention.

Therefore, in accordance with an embodiment of the invention, a method of reducing the write time of a DRAM cell is disclosed, wherein the cell voltage of DRAM cell 102 is preset to an intermediate voltage level prior to a write operation, thereby reducing the amount of time taken for the cell voltage to reach its final stored state (logic 1 or logic 0). FIG. 2 illustrates a simplified block diagram for a DRAM architecture 200, which may be utilized in conjunction with the foregoing described embodiments of the method. A static random access memory (SRAM) cache 202 provides a temporary storage element for data to read from and to be written to a DRAM array 204. A controller 206 receives an operational command and corresponding address from a requesting system (such as a CPU) and directs the cell preset operation at the selected DRAM array, as well as writing the new data stored in the SRAM cache 202. It will readily be appreciated that if the cell voltage is preset to an intermediate voltage value prior to a write operation, any data contained therein is lost. Thus, the SRAM cache 202 stores data read from DRAM array 204, which data is to be later written back thereto in accordance with a delayed write back scheduling.

One example of a delayed write back schedule may be a "direct mapping" schedule in which a scheduler (not shown) causes the SRAM to hold data read from a DRAM array, as well as newly written data from a write buffer (not shown), in a specific SRAM address until such time as the specific address in the SRAM is again needed for a subsequent read or write operation. At that time, the SRAM would write back the data in the needed SRAM address to the corresponding DRAM array. Alternatively, the SRAM may store data bits in its lowest address which does not already contain any data bits therein. The scheduler may determine whether there is any data in the SRAM to be written back to a dram array and, if so, then the oldest data therein is written back to the corresponding DRAM array.

Figure 3A:
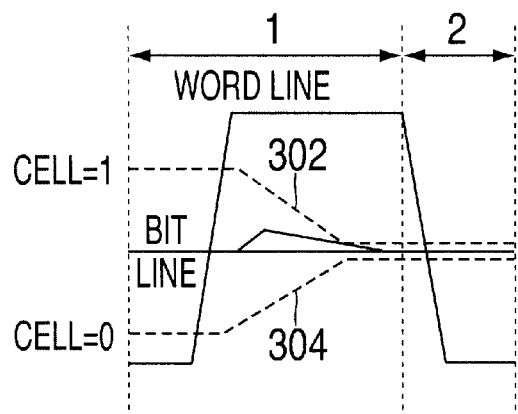
FIG. 3(a) is a signal timing diagram illustrating the DRAM cell voltage characteristics during a cell preset operation performed in accordance with an embodiment of the invention.
Figure 3B:
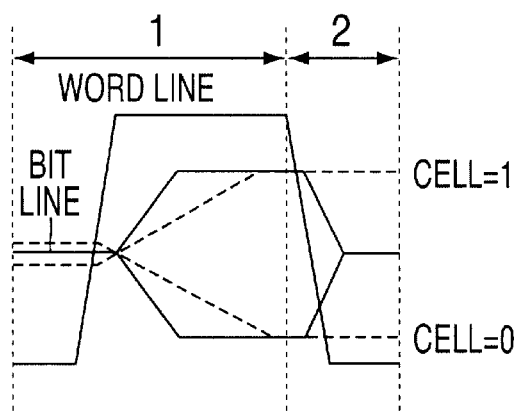
FIG. 3(b) is a signal timing diagram illustrating the DRAM cell voltage characteristics during a write-back operation performed after the cell preset operation illustrated in FIG. 3(a)
Figure 3C:
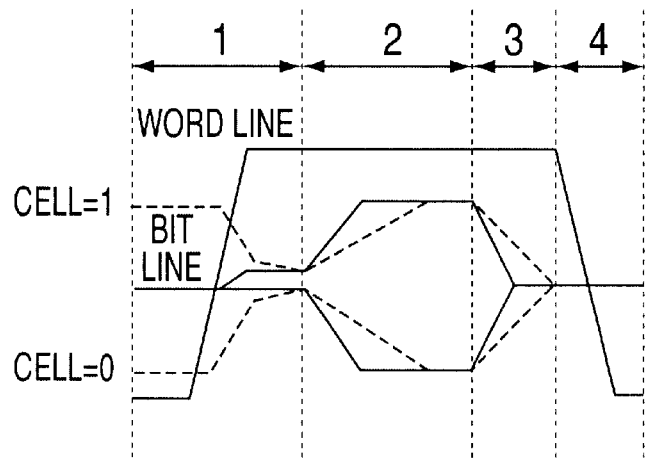
FIG. 3(c) is a signal timing diagram illustrating the DRAM cell voltage characteristics during a combination destructive read operation and cell preset operation for a future delayed write back scheduled in a destructive read architecture.

The advantages of presetting the cell voltage to an intermediate level prior to a write operation may be understood by reference to FIGS. 3(a)–(c). Specifically, FIG. 3(a) is a timing diagram which illustrates a "half $V_{DD}$" preset operation prior to a write operation. This write operation may also be referred to as a destructive write architecture for presetting an intermediate voltage to near halfway betwen the logic 0 and logic 1 voltage levels.

Initially, the DRAM cell 102 contains a stored bit, wherein the capacitor 106 voltage is either at $V_{DD}$=3.0 volts (logic 1) or 0 volts (logic 0). Once a write command is received for cell 102, wordline WL is activated and capacitor 106 is coupled to BL, which is precharged to ½ $V_{DD}$. Again, during this coupling, a charge transfer occurs which raises the voltage on BL slightly while also discharging the cell voltage toward the value of the voltage of BL. Assuming the cell 102 initially contains a "1" bit, the change in cell voltage is indicated by dashed line 302. At the end of phase 1 in FIG. 3(a), the cell voltage is equal to the voltage on BL, which is slightly higher than the precharge value of ½ $V_{DD}$. Then, in phase 2, WL is deactivated and the BL voltage is equalized with the BL bar voltage at ½ $V_{DD}$. The cell voltage has thus been preset at a value which is approximately equal to, and slightly higher than, ½ $V_{DD}$. It should be noted that if the cell voltage were initially 0 volts, then the preset value will be slightly less than ½ $V_{DD}$, as indicated by dashed line 304. During this preset condition, the SRAM 202 stores data bits received from data input signals. The actual write back from SRAM 202 to the cell 102 is scheduled as a delayed write back, similar to the destructive read architecture.

FIG. 3(b) illustrates a write operation scheduled after the cell preset operation in FIG. 3(a). Initially, the cell voltage is preset to just above ½ $V_{DD}$ or just below ½ $V_{DD}$. Then, when WL is activated, the data to be written into cell 102 is transferred from the SRAM cache 202, through wDL and write driver 112a (FIG. 1), and onto the bitline BL. BL then goes from the precharged state at ½ VDD to either $V_{DD}$ (3.0 volts) or 0 volts, depending upon the written data bit. Accordingly, the voltage on capacitor 106 then either fully charges to $V_{DD}$ or fully discharges to 0 volts. Afterward, WL is deactivated and the capacitor 106 is isolated from BL, which is once again precharged to ½ $V_{DD}$.

Referring now to FIG. 3(c), the timing diagram therein illustrates the implementation of the cell preset operation during a destructive read. Once again, the cell 102 initially has a "1" bit or a "0" bit stored therein. In phase 1, the wordline WL is activated in response to a read command. Capacitor 106 is then coupled to bitline BL, thereby creating a differential voltage on BL and BL bar. The differential voltage is then sensed by sense amplifier 108 in phase 2, and the voltage on BL is driven to either the logic 1 level or the logic 0 level. The cell voltage, still coupled to BL, follows the value of BL. However, during phase 3 (bitline precharging), the wordline WL is not yet deactivated as would be the case in a conventional operation. As a result, capacitor 106 remains coupled to BL during the precharging operation, and thus the cell voltage continues to follow the voltage on BL as it is equalized to ½ $V_{DD}$. In this situation, a cell voltage preset is achieved by keeping WL energized while the bitline precharging takes place. Notably, the preset cell voltage value is right at ½ $V_{DD}$ in this case, since the bitlines are precharged while WL is still activated.

It is readily apparent that the time in which it takes the cell voltage to change from a preset value (at about ½ $V_{DD}$) UP to the full value of $V_{DD}$, or down to 0 volts, is less than the time it takes for the cell voltage to be completely flipped from one logic state to the opposite. Therefore, by presetting the cell voltage to an intermediate level during an earlier pipeline stage, the time taken to execute a write operation during a later pipeline stage is significantly reduced.

Figure 4A:
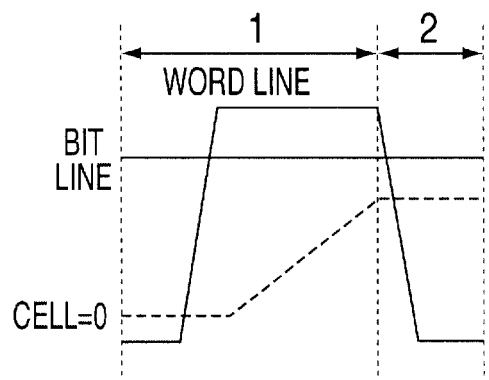
FIG. 4(a) is a signal timing diagram illustrating the DRAM cell voltage characteristics during a cell preset operation performed in accordance with an alternative embodiment of the invention.

On the other hand, it has also been found that with NMOS type transistors commonly used in DRAM operations, it takes longer for a cell to be written from logic 0 to logic 1 than it does for the cell to be written from logic 1 to logic 0. Therefore, in accordance with an alternative embodiment of the invention, a method for reducing the write time of a DRAM cell is disclosed. In this embodiment, the cell voltage of DRAM cell 102 is preset to a "near $V_{DD}$" voltage level prior to a write operation, which "near VDD" voltage level is slightly less than the logic 1 voltage level. Such a preset operation is shown in FIG. 4(a). This write operation may also be referred to a destructive write architecture for presetting an intermediate voltage to near $V_{DD}$.

It will immediately be recognized that, unlike the previous embodiment, the bitlines are precharged not at ½ $V_{DD}$, but at $V_{DD}$. In this manner, the cell voltage can be preset to a near $V_{DD}$ level by coupling the capacitor 106 to the precharged BL. In the diagram shown in FIG. 4(a), a "0" bit is stored in cell 102 prior to a write operation instruction. A near $V_{DD}$ preset is executed when WL is activated, as seen in phase 1. The data in the cell is lost as the capacitor 106 charges up toward $V_{DD}$. Once WL is deactivated, the cell 102 is preset to a voltage which is between ½ $V_{DD}$ and $V_{DD}$, in the neighborhood of about ¾ $V_{DD}$. Again, the actual write back from SRAM 202 to the cell 102 is scheduled as a delayed write back, similar to the destructive read architecture.

Figure 4B:
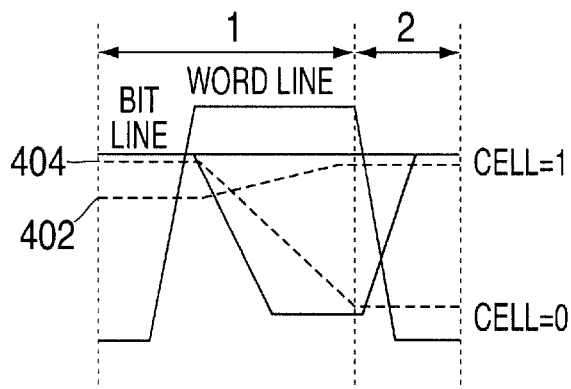
FIG. 4(b) is a signal timing diagram illustrating the DRAM cell voltage characteristics during a write-back operation performed after the cell preset operation illustrated in FIG. 4(a)

In FIG. 4(b), a write operation is scheduled after the cell voltage preset operation shown in FIG. 4(a). Dotted line 402 represents the cell voltage previously preset to a level between ½ $V_{DD}$ and $V_{DD}$. When WL is activated, the capacitor 106 is coupled to BL, which carries the data for a "1" bit to be written into the cell 102. Thereafter, the cell voltage is increased from the near ½ $V_{DD}$ level to the $V_{DD}$ level, thereby storing a "1" bit therein. Because the cell voltage was initial preset to the near $V_{DD}$ level, a significant amount of write time is saved in pulling the cell voltage up to the full $V_{DD}$ level.

Dotted line 404 illustrates the writing of a "0" bit following the near $V_{DD}$ preset operation. It will be noted that the preset cell voltage in this instance is higher than the preset voltage illustrated by dotted line 402. This is because, in the example presented, the cell 102 initially had a "1" bit stored therein prior to the preset operation. Thus, since the cell voltage was already about $V_{DD}$ prior to the preset, there is a negligible change in the cell voltage when it is then coupled to BL for a near $V_{DD}$ preset operation. When WL is activated for the "0" bit write operation, the bitline voltage drops to 0 volts, and the cell voltage follows the bitline voltage. When WL is then deactivated, the "0" bit is stored within the cell and BL is precharged back up to $V_{DD}$.

Figure 4C:
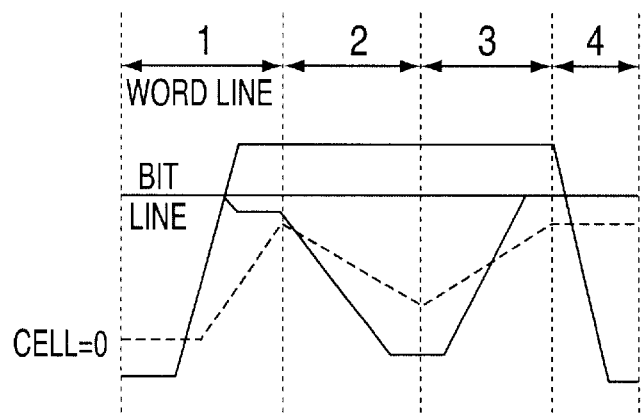
FIG. 4(c) is a signal timing diagram illustrating the DRAM cell voltage characteristics during a combination destructive read operation and cell preset operation for a future delayed write back scheduled in a destructive read architecture.

Finally, FIG. 4(c) illustrates the implementation of the near $V_{DD}$ cell preset operation during a destructive read. The cell 102 initially has a "0" bit stored therein. In phase 1, the wordline WL is activated in response to a read command. Capacitor 106 is then coupled to bitline BL (precharged with BL bar at $V_{DD}$), thereby creating a differential voltage on BL and BL bar. The differential voltage is then sensed by sense amplifier 108 in phase 2, and the voltage on BL is driven to the logic 0 level for the read operation. The cell voltage, still coupled to BL, follows the value of BL. During phase 3 (bitline precharging), the wordline WL is still activated. As a result, capacitor 106 remains coupled to BL during the precharging operation, and thus the cell voltage continues to follow the voltage on BL as it is equalized with BL bar back up to $V_{DD}$. Accordingly, the cell voltage preset is achieved at a near $V_{DD}$ value after WL is deactivated in phase 4.

Through the use of a cell voltage preset operation, as shown above, it has been demonstrated how write time to a DRAM cell may be saved, particularly in those instances where a newly written bit is the opposite of a previously stored bit. This entails the use of a "destructive write" design, wherein the data in the cell to be written is intentionally lost prior to the write operation. Accordingly, an SRAM or other suitable temporary storage element is used to temporarily store the data to be written to an addressed DRAM cell. In one embodiment, a preset operation entails setting the cell voltage to an intermediate value, about halfway between the logic 0 voltage value and the logic 1 voltage value. In another embodiment, the preset operation entails setting the cell voltage value to a value which is near the logic 1 voltage level since, with NMOS transistor technology, the longest conventional write operation is writing from logic 0 to logic 1.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for preparing a dynamic random access memory (DRAM) cell for a write operation, the method comprising:
   creating a preset voltage level within the cell, said preset voltage level having a value between a logic 0 voltage level and a logic 1 voltage level;
   wherein said logic 0 voltage level corresponds to a first cell voltage value when the cell has a 0 bit stored therein, and said logic 1 voltage level corresponds to a second cell voltage value when the cell has a 1 bit stored therein.

2. The method of claim 1, wherein:
   prior to said creating a preset voltage level within the cell, the cell has an initial voltage value corresponding to either said logic 0 voltage level or said logic 1 voltage level.

3. The method of claim 2, wherein said preset voltage level is about halfway between said logic 1 voltage level and said logic 0 voltage level.

4. The method of claim 3, wherein said preset voltage level is greater than half the difference between said logic 1 voltage level and said logic 0 voltage level if said initial voltage value of the cell corresponds to said logic 1 voltage level.

5. The method of claim 3, wherein said preset voltage level is less than half the difference between said logic 1 voltage level and said logic 0 voltage level if said initial voltage value of the cell corresponds to said logic 0 voltage level.

6. The method of claim 2, wherein said preset voltage level is at least ¾ of said logic 1 voltage level.

7. A method for reducing the write time for a dynamic random access memory (DRAM) cell, the cell including a data bit storage element for storing a data bit at a logic 0 voltage level or at a logic 1 voltage level, the method comprising:
   receiving a write command from a controller;
   responsive to said write command, creating a preset voltage level within the cell, said preset voltage level having an intermediate value between the logic 0 voltage level and the logic 1 voltage level; and
   coupling the cell to a write signal;
   wherein said write signal, when coupled to the cell, drives the cell voltage from said preset voltage level to either the logic 0 voltage level or the logic 1 voltage level.

8. The method of claim 7, wherein said preset voltage level is about halfway between the logic 1 voltage level and the logic 0 voltage level.

9. The method of claim 8, wherein:
   said creating a preset voltage level within the cell is executed by coupling the cell to a bit line, said bit line having a precharged voltage thereupon which is about halfway between the logic 1 voltage level and the logic 0 voltage level.

10. The method of claim 9, wherein:
    prior to said creating a preset voltage level within the cell, the cell has an initial voltage value corresponding to either said logic 0 voltage level or said logic 1 voltage level.

11. The method of claim 10, wherein said preset voltage level is greater than half the difference between said logic 1 voltage level and said logic 0 voltage level if said initial voltage value of the cell corresponds to said logic voltage level.

12. The method of claim 10, wherein said preset voltage level is less than half the difference between said logic 1 voltage level and said logic 0 voltge level if said initial voltage value of the cell corresponds to said logic 0 voltage level.

13. The method of claim 7, wherein the data bit to be written into the cell is stored in a temporary storage element during said presetting the cell voltage.

14. The method of claim 13, wherein said temporary storage element comprises a static random access memory (SRAM).

15. The method of claim 7, wherein said preset voltage level is at least ¾ of the value of the logic 1 voltage level.

16. The method of claim 15, wherein:
    said creating a preset voltage level within the cell is executed by coupling the cell to a bit line, said bit line having a precharged voltage thereupon which is about equal to the logic 1 voltage level.

17. A computer memory element, comprising:
    a dynamic random access (DRAM) cell, said cell having a preset voltage level set therein prior to a write operation, said preset voltage level having a value between a logic 0 voltage level and a logic 1 voltage level;
    wherein said logic 0 voltage level corresponds to a first cell voltage value when said cell has a 0 bit stored therein, and said logic 1 voltage level corresponds to a second cell voltage value when said cell has a 1 bit stored therein.

18. The computer memory element of claim 17, wherein:
    prior to said write operation, the cell has an initial voltage value corresponding to either said logic 0 voltage level or said logic 1 voltage level.

19. The computer memory element of claim 18, wherein said preset voltage level is about halfway between said logic 1 voltage level and said logic 0 voltage level.

20. The computer memory element of claim 19, wherein said preset voltage level is greater than half the difference between said logic 1 voltage level and said logic 0 voltage level if said initial voltage value of the cell corresponds to said logic 1 voltage level.

21. The computer memory element of claim 19, wherein said preset voltage level is less than half the difference between said logic 1 voltage level and said logic 0 voltage level if said initial voltage value of the cell corresponds to said logic 0 voltage level.

22. The computer memory element of claim 18, wherein said preset voltage level is at least ¾ of said logic 1 voltage level.

23. A computer memory system, comprising:
    a dynamic random access memory (DRAM) cell, the cell including a data bit storage element for storing a data bit at a logic 0 voltage level or at a logic 1 voltage level;
    a controller, said controller generating a write command for said cell;
    said cell, responsive to said write command from said controller, having a preset cell voltage therein, said cell voltage being at an intermediate voltage level between said logic 0 voltage level and said logic 1 voltage level; and a write signal, coupled to said cell;

wherein when said write signal is coupled to said cell, the cell voltage is driven from said intermediate voltage level to either said logic 0 voltage level or said logic 1 voltage level.

24. The computer memory system of claim 23, wherein said intermediate voltage level is about halfway between said logic 1 voltage level and said logic 0 voltage level.

25. The computer memory system of claim 24, further comprising:

a bit line, coupled to said cell, and selectively coupled to said data bit storage element within said cell;

said bit line having a precharged voltage thereupon which is about halfway between said logic 1 voltage level and said logic 0 voltage level;

wherein said cell voltage is preset to said intermediate voltage level between said logic 0 voltage level and said logic 1 voltage level when said bit storage element is coupled to said bit line.

26. The computer memory system of claim 25, wherein:

prior to said cell having said intermediate voltage level preset therein, said cell has an initial voltage value, said initial voltage value corresponding to either said logic 0 voltage level or said logic 1 voltage level.

27. The computer memory system of claim 26, wherein said preset voltage level is greater than half the difference between said logic 1 voltage level and said logic 0 voltage level if said initial voltage value of the cell corresponds to said logic 1 voltage level.

28. The computer memory system of claim 26, wherein said preset voltage level is less than half the difference between said logic 1 voltage level and said logic 0 voltge level if said initial voltage value of the cell corresponds to said logic 0 voltage level.

29. The computer memory system of claim 23, further comprising:

a temporary storage element, said temporary storage element storing said data bit to be written into said cell during the time said cell has said intermediate voltage level preset therein.

30. The computer memory system of claim 29, wherein said temporary storage element comprises a static random access memory (SRAM).

31. The computer memory system of claim 23, wherein said intermediate voltage level is at least ¾ of the value of said logic 1 voltage level.

32. The computer memory system of claim 31, further comprising:

a bit line, coupled to said cell, and selectively coupled to said data bit storage element within said cell;

said bit line having a precharged voltage thereupon which is about equal to said logic 1 voltage level;

wherein said cell voltage is preset to said intermediate voltage level when said bit storage element is coupled to said bit line.

* * * * *